United States Patent
Kobayashi

(10) Patent No.: US 8,815,015 B2
(45) Date of Patent: Aug. 26, 2014

(54) APPARATUS AND METHOD FOR FABRICATING ORGANIC LIGHT EMITTING DIODE DISPLAY DEVICE

(75) Inventor: Ikunori Kobayashi, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 1056 days.

(21) Appl. No.: 12/385,620

(22) Filed: Apr. 14, 2009

(65) Prior Publication Data

US 2009/0286447 A1 Nov. 19, 2009

(30) Foreign Application Priority Data

May 15, 2008 (KR) .......................... 10-2008-0045014

(51) Int. Cl.
*C23C 16/00* (2006.01)

(52) U.S. Cl.
USPC .......................................... 118/721; 118/720

(58) Field of Classification Search
USPC .................... 118/721, 728, 720, 729; 427/256
See application file for complete search history.

(56) References Cited

U.S. PATENT DOCUMENTS

| | | | | |
|---|---|---|---|---|
| 3,786,220 A | * | 1/1974 | Harnden, Jr. ................. | 219/622 |
| 4,459,104 A | * | 7/1984 | Wollmann ..................... | 432/123 |
| 4,696,501 A | * | 9/1987 | Webb ............................ | 294/86.4 |
| 5,536,466 A | * | 7/1996 | Ogawa et al. ................. | 264/400 |
| 5,636,960 A | * | 6/1997 | Hiroki et al. .................. | 414/781 |
| 6,183,809 B1 | * | 2/2001 | Sakuragi et al. .............. | 427/239 |
| 6,273,275 B1 | * | 8/2001 | Kim et al. .................... | 211/41.18 |
| 6,466,352 B1 | * | 10/2002 | Shahar et al. ............... | 359/212.1 |
| 7,355,313 B2 | * | 4/2008 | Takamatsu et al. ..... | 310/216.016 |
| 2001/0006827 A1 | * | 7/2001 | Yamazaki et al. .............. | 438/30 |
| 2003/0224109 A1 | * | 12/2003 | Kang et al. ..................... | 427/282 |
| 2005/0036267 A1 | * | 2/2005 | Savas et al. .................... | 361/234 |
| 2006/0076809 A1 | * | 4/2006 | Ravid et al. ................ | 297/216.1 |
| 2006/0185595 A1 | * | 8/2006 | Coll et al. ...................... | 118/724 |
| 2007/0137571 A1 | * | 6/2007 | Kim et al. ...................... | 118/721 |
| 2009/0061440 A1 | * | 3/2009 | Tanabe et al. ..................... | 435/6 |
| 2010/0038252 A1 | * | 2/2010 | Kasuya ........................... | 205/89 |
| 2012/0112224 A1 | * | 5/2012 | Le Bellac et al. ............... | 257/98 |

FOREIGN PATENT DOCUMENTS

| | | |
|---|---|---|
| JP | 04136166 A | 5/1992 |
| JP | 04089547 U | 8/1992 |
| JP | 09-025561 | 1/1997 |
| JP | 09-239954 | 9/1997 |
| JP | 09-306415 | 11/1997 |
| JP | 10-041069 | 2/1998 |

(Continued)

OTHER PUBLICATIONS

Enlgish translation of JP 2002-075638, Kitaatsume, Mar. 2002.*

*Primary Examiner* — Keath Chen
(74) *Attorney, Agent, or Firm* — Robert E. Bushnell, Esq.

(57) ABSTRACT

An apparatus and method for fabricating an organic light emitting diode display device are provided. The apparatus for fabricating an organic light emitting diode display device includes a chamber, a mask disposed in the chamber to mount a substrate on the upper surface thereof and having a certain pattern of openings, a deposition material source disposed under the mask and supplying a deposition material to the mask through the openings of the mask to form a layer on the substrate, and a holding unit pressing the substrate toward the mask. The holding unit includes a member that is capable of being deformed according to a deformed shape of the substrate such that the mask closely contacts the substrate.

11 Claims, 8 Drawing Sheets

(56) References Cited

FOREIGN PATENT DOCUMENTS

| | | |
|---|---|---|
| JP | 2001003155 A | 1/2001 |
| JP | 2002075638 A | 3/2002 |
| JP | 2003138375 A | 5/2003 |
| JP | 2003-332056 | 11/2003 |
| JP | 2004183105 A | 7/2004 |
| JP | 2004214015 A | 7/2004 |
| JP | 2005-158571 | 6/2005 |
| JP | 2005-248249 | 9/2005 |
| JP | 2005281746 A | 10/2005 |
| JP | 2006169625 A | 6/2006 |
| JP | 2006176809 A | 7/2006 |
| JP | 2007046099 A | 2/2007 |
| JP | 2007207632 A | 8/2007 |
| JP | 2008059757 A | 3/2008 |
| JP | 2008108596 A | 5/2008 |
| KR | 1020050051551 A | 6/2005 |

\* cited by examiner

APPARATUS AND METHOD FOR FABRICATING ORGANIC LIGHT EMITTING DIODE DISPLAY DEVICE

CLAIM OF PRIORITY

This application makes reference to, incorporates the same herein, and claims all benefits accruing under 35 U.S.C. §119 from an application earlier filed in the Korean Intellectual Property Office on 15 May 2008 and there duly assigned Serial No. 10-2008-0045014.

BACKGROUND OF THE INVENTION

1. Field of the Invention

The present invention relates to an apparatus and method for fabricating an organic light emitting diode display device, and more particularly, to an apparatus and method for fabricating an organic light emitting diode display device capable of depositing a layer on a substrate to fabricate the organic light emitting diode display device.

2. Description of the Related Art

In general, in order to solve problems of conventional display devices such as cathode ray tubes, and so on, flat panel displays have been developed and released. Such flat panel displays may be classified into a liquid crystal display, an organic light emitting diode display device, a plasma display panel (PDP), and so on.

Among the flat panel displays, the organic light emitting diode display device has advantages such as a small thickness, rapid response, simple manufacture, and low cost. Therefore, in recent times, the organic light emitting diode display device has been widely used as one of the flat panel displays.

Meanwhile, flat panel displays have become larger. Therefore, the organic light emitting diode display device has also become larger with the increase in size of the flat panel displays. However, the large size of the flat panel displays has brought various new problems. For example, a method of fabricating an organic light emitting diode display device includes depositing a layer having a certain pattern on a substrate formed of glass. At this time, the layer deposition process is performed by attaching a mask having a predetermined pattern of openings to the lower surface of the substrate, and then evaporating a predetermined deposition material such as an organic material, an electrode material, and so on, from under the mask toward the mask. Therefore, the evaporated deposition material is deposited on the substrate through the openings of the mask to form a layer having a certain pattern on the substrate.

However, since the large size of the flat panel displays requires the use of a larger size substrate having the layer formed thereon and a larger size mask adhering to the substrate, for example, a central area of the substrate and the mask adhering to the substrate may be sagged.

Therefore, a portion of the mask may not completely contact the lower surface of the substrate due to the sagging. As a result, a predetermined size of space, i.e., a loosened space is formed between the portions of the substrate and the mask. Therefore, the deposition material evaporated toward the mask is deposited into the space, which causes degradation of the pattern layer formed on the substrate.

Japanese Patent Laid-open Publication No. H10-41069, "Method of Fabricating Organic Light Emitting Diode Display Device," published on Feb. 13, 1998, discloses a method of attaching a mask to a substrate. According to the above publication, a mask is disposed at one surface of the substrate, and a magnetic field source is disposed at the other side of the substrate opposite the one surface such that the mask is attracted by the magnetic field. Therefore, the mask adheres to the substrate by the magnetic field generated from the magnetic field source.

However, when the substrate and the mask adhering thereto become larger, the above method also causes new problems. That is, when the substrate and the mask become larger, for example, a center area of a portion of the substrate and the mask adhering to the mask may be sagged downward. Even when the sagging occurs, the magnetic field source generates a strong enough magnetic field by which the mask is adhering to the substrate. However, the strong magnetic field distorts the mask, which should adhere to the substrate, causing degradation of the pattern layer formed on the substrate.

SUMMARY OF THE INVENTION

The present invention provides an apparatus and method for fabricating an organic light emitting diode display device capable of accurately aligning a mask to a substrate during a layer deposition process even when the substrate and the mask become larger.

According to an aspect of the present invention, an apparatus for fabricating an organic light emitting diode display device is provided. The apparatus for fabricating an organic light emitting diode display device includes a chamber; a mask disposed inside the chamber and having a pattern of openings, a deposition material source, and a holding unit disposed above the substrate. A substrate is mounted on an upper surface of the mask. The deposition material source is disposed under the mask and supplies a deposition material to the substrate through the openings of the mask to form a layer on the substrate. The holding unit presses the substrate toward the mask. The holding unit includes a flexible member that is deformed according to a bending shape of the substrate.

The flexible member may include a flexible plate that contacts the substrate while the holding unit presses the substrate toward the mask, and the holding unit may further include a conveyor for conveying the flexible plate onto the substrate. The flexible plate is deformed according to a deformed shape of the substrate. At this time, the flexible plate may be a thin metal plate formed of a metal material and having a thickness to provide flexibility. In this case, the thin metal plate may have a thickness of 0.1 mm to 0.6 mm.

The mask may be formed of a magnetic metal material, and a magnet may be disposed on the flexible plate to apply a magnetic force to the mask to pull the mask toward the substrate when the flexible plate presses the substrate. The flexible plate may be formed of a non-magnetic thin metal plate.

The flexible member may include an elastic member installed at the lower surface of the pressing plate and deformed according to a deformed shape of the substrate when the pressing plate presses the substrate. The holding unit may include a pressing plate disposed on the substrate to press the substrate, and a conveyor coupled to an upper part of the pressing plate to convey the pressing plate toward the substrate such that the pressing plate presses the substrate. At this time, the elastic member may have a certain thickness to be deformed according to a deformed shape of the substrate, and may be formed of an elastic material such as silicon rubber. In this case, the elastic member may have a thickness of 2 mm to 5 mm.

The mask may be formed of a magnetic metal material, and a magnet may be disposed on the pressing plate to apply a magnetic force to the mask to pull the mask toward the substrate when the pressing plate presses the upper surface of the substrate. The pressing plate may be formed of a non-magnetic metal plate.

According to another aspect of the present invention, a method of fabricating an organic light emitting diode display device is provided. The method includes steps of loading a mask inside a chamber where the mask having a pattern of openings, disposing a substrate on an upper surface of the mask, pressing the substrate toward the mask with a holding unit to make the mask contact the substrate, and supplying a deposition material toward the mask from a deposition material source that is disposed under the mask to form a layer on the substrate through the openings of the mask.

The holding unit may include a flexible plate that contacts the substrate while the substrate is pressed toward the mask, and a conveyor for conveying the flexible plate onto the substrate. The flexible plate deformed according to a deformed shape of the substrate. The step of pressing the substrate may include disposing the flexible plate on the substrate using the conveyor such that the substrate is pressed by the weight of the flexible plate. At this time, the flexible plate may be a thin metal plate formed of a metal material and having a thickness to provide flexibility. In this case, the thin metal plate may have a thickness of 0.1 mm to 0.6 mm.

The mask may be formed of a magnetic metal material, and the flexible plate may be formed of a non-magnetic thin metal plate. In addition, a magnet may be disposed on the flexible plate, and the step of pressing the substrate may further include applying a magnetic force to the mask using the magnet such that the mask is pulled toward the substrate when the substrate is pressed by the weight of the flexible plate.

The holding unit may include a pressing plate for pressing the substrate, an elastic member installed at a lower surface of the pressing plate and deformed according to a deformed shape of the substrate while the pressing plate presses the substrate, and a conveyor coupled to an upper part of the pressing plate to convey the pressing plate. The step of pressing substrate may include conveying the pressing plate toward the substrate using the conveyor such that the substrate is pressed by the pressing plate and by the elastic member. At this time, the elastic member may have a certain thickness to be deformed according to a deformed shape of the substrate, and may be formed of an elastic material such as silicon rubber. In this case, the elastic member may have a thickness of 2 mm to 5 mm.

The mask may be formed of a magnetic metal material, and the pressing plate may be formed of a non-magnetic metal plate. In addition, a magnet may be disposed on the pressing plate, and the step of pressing the substrate may further include applying a magnetic force to the mask using the magnet such that the mask is pulled toward the lower surface of the substrate when the pressing plate presses the upper surface of the substrate.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
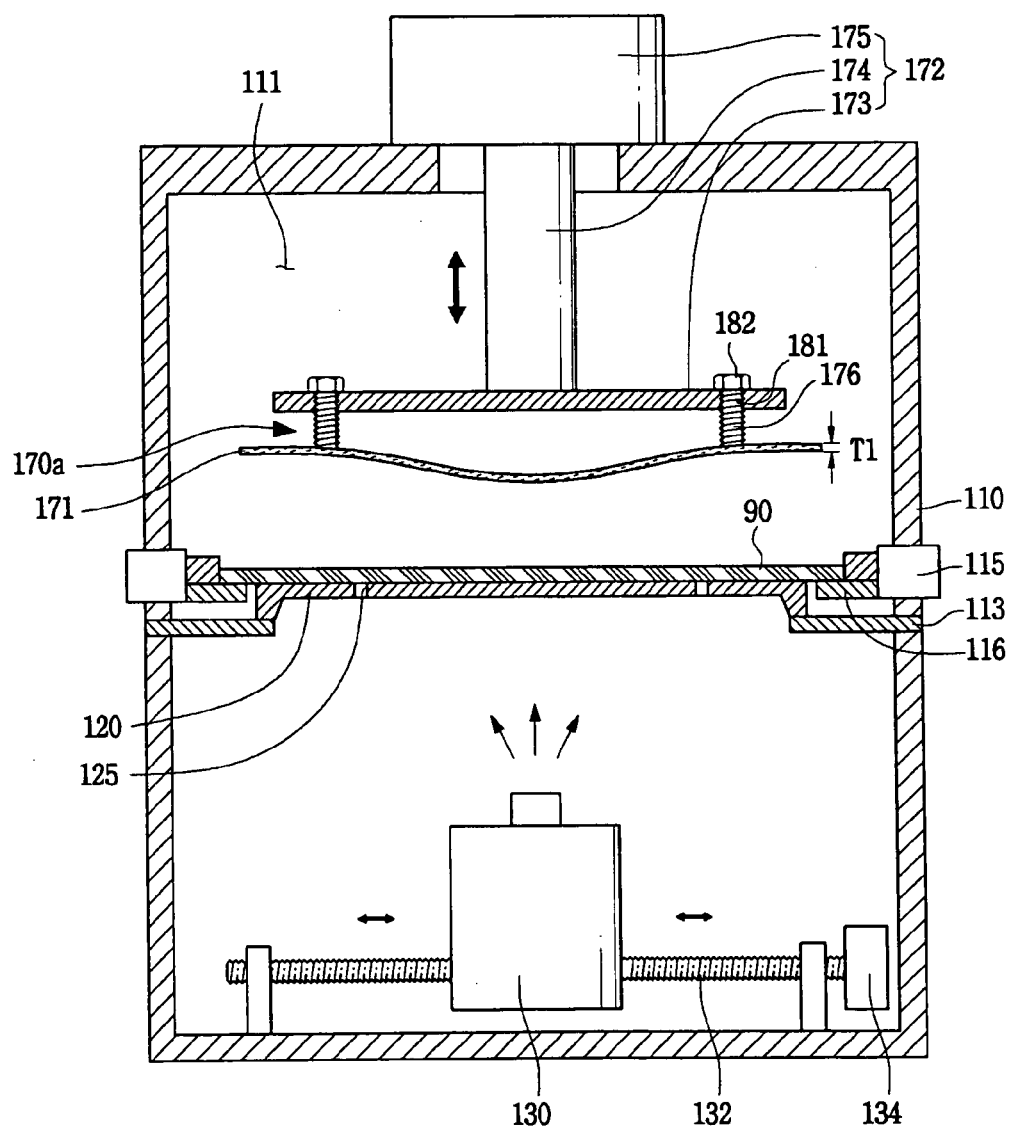
FIG. 1 is a cross-sectional view of an apparatus for fabricating an organic light emitting diode display device in accordance with a first exemplary embodiment of the present invention.

The present invention will be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions may be exaggerated for clarity. Like reference numerals designate like elements throughout the specification.

Embodiments of Apparatus for Fabricating Organic Light Emitting Diode Display Device FIG. 1 is a cross-sectional view of an apparatus for fabricating an organic light emitting diode display device in accordance with a first exemplary embodiment of the present invention.

Referring to FIG. 1, the apparatus for fabricating an organic light emitting diode display device in accordance with a first exemplary embodiment of the present invention functions to deposit a layer, for example an organic layer or an electrode layer, on a substrate 90 to fabricate an organic light emitting diode display device. The apparatus includes a chamber 110, a mask 120, a deposition material source 130, and a holding unit. The mask 120 is disposed inside the chamber on which a substrate 90 is mounted. The mask 120 has a pattern of openings 125. The deposition material source 130 supplies a deposition material toward the mask 120 to form a layer on the substrate 90 through the openings 125 of the mask 120. The holding unit 170a presses the substrate 90 downward to make the substrate 90 contact the mask 120 in order to prevent any space that could be formed between the substrate 90 and the mask 120.

More specifically, the chamber 110 has a process space 111, in which a process is performed. Therefore, a layer deposition process for fabricating the organic light emitting diode display device is performed in the process space 111 of the chamber 110.

In addition, a mask support frame 113 is installed inside the chamber 110 through which the mask 120 is held in the process space in the chamber 110. For example, the mask support frame 113 is installed at an inner wall of a center part of the chamber 110. At this time, the mask support frame 113 may project inwardly from the inner wall of the center part of the chamber 110 to a certain length to support edges of the mask 120. Therefore, the mask 120 is loaded into the chamber 110 such that the edges of the mask 120 are supported by the mask support frame 113 installed in the chamber 110.

Meanwhile, after the mask 120 is disposed in the chamber 110, the substrate 90 is disposed on an upper surface of the mask 120. In other words, after the mask 120 is loaded into the chamber 110 being supported by the mask support frame 113, the substrate 90 is mounted on the upper surface of the mask 120. At this time, the substrate 90 may be conveyed by a substrate conveyor 115 that is vertically movably installed at the inner wall of the chamber 110 and disposed on the mask support frame 113. That is, when the substrate 90 loaded inside the chamber 110 and is mounted on the substrate conveyor 115 disposed over the mask support frame 113, the substrate conveyor 115 downwardly moves toward the mask support frame 113 to mount the substrate 90 on the upper surface of the mask 120. A substrate support frame 116 inwardly extends from the substrate conveyor 115 to support edges of the substrate 90.

The deposition material source 130 is disposed inside the chamber 110 and in a space under the mask 120 to supply a deposition material toward the mask 120. For example, the deposition material source 130 upwardly evaporates a predetermined deposition material such as an organic material or an electrode material toward the mask 120 to supply the deposition material toward the mask 120. In this case, the deposition material source 130 may be an evaporation source for heating a deposition material at a high temperature to evaporate the deposition material.

In addition, the deposition material source 130 is horizontally movably installed in the chamber 110 to a predetermined distance. In other words, a conveyance unit may be installed in the chamber 110 to horizontally convey the deposition material source 130 to a predetermined distance. At this time, the conveyance unit may include a ball screw shaft 132, a motor 134, and so on, to convey the deposition material source 130 using a ball-screw mechanism.

The holding unit 170a presses the upper surface of the substrate 90 toward the mask 120 such that the mask 120 contacts the lower surface of the substrate 90. At this time, the holding unit 170a includes a part that can be deformed according to a bending shape of the substrate 90 to tightly press the upper surface of the substrate 90. That is, in the layer deposition process, and so on, even though the center area of the large-sized substrate 90 and mask 120 are sagged or bent downward, the holding unit 170a is deformed according to the bending shape of the substrate 90, and uniformly presses the upper surface of the substrate. As a result, the lower surface of the substrate 90 contacts the upper surface of the mask 120 to prevent any space that can be otherwise formed between the lower surface of the substrate 90 and the upper surface of the mask 120. Therefore, using the holding unit 170a in accordance with the present invention, it is possible to prevent degradation of a pattern layer caused by the loosened space between the substrate 90 and the mask 120 and to achieve deposition of a good pattern layer on the substrate 90.

Specifically, the holding unit 170a includes a flexible plate 171 disposed on the upper surface of the substrate 90 to press the upper surface of the substrate 90 by its weight, a conveyor 172 installed in the chamber 110 to convey the flexible plate 171 onto the upper surface of the substrate 90 when the substrate 90 is mounted on the upper surface of the mask 120, and a connection member 176 for connecting the flexible plate 171 to the conveyor 172. The flexible plate 171 is deformed according to a bending shape of the substrate 90. The flexible plate 171 can be referred to as an embodiment of a flexible member. In this case, the flexible member includes the flexible plate 171.

At this time, the flexible plate 171 may be formed of a relatively heavy metal material to press the substrate 90 by its weight. For example, the flexible plate 171 may be formed of stainless steel or tungsten. In addition, the flexible plate 171 formed of the metal material may be formed of a thin plate having a thickness T1 such that the flexible plate 171 can be deformed according to a bending shape of the substrate 90. For example, the flexible plate 171, i.e., the thin metal plate, may have a thickness T1 of 0.1 mm to 0.6 mm.

Further, the conveyor 172 includes a conveyance plate 173 disposed over the flexible plate 171 and spaced apart by a predetermined distance from the flexible plate 171, a conveyance rod 174 connected to an upper part of the conveyance plate 173, and a conveyance body 175 connected to the conveyance plate 173 via the conveyance rod 174 and vertically moving the conveyance rod 174 to vertically convey the conveyance plate 173. At this time, the conveyance body 175 may be installed at an outer wall of the chamber 110, and may be implemented by a cylinder, a motor, and so on. Meanwhile, when the conveyance body 175 is implemented by the cylinder, the conveyance rod 174 may be implemented by a piston. In addition, when the conveyance body 175 is implemented by the motor, the conveyance rod 174 may be implemented by a ball screw shaft vertically movable according to rotation of the motor. However, the conveyor 172 in accordance with the present invention may be implemented by another method in addition to the cylinder or the ball screw shaft.

The connection member 176 functions to connect the flexible plate 171 to the conveyance plate 173 of the conveyor 172. The connection member 176 may also be implemented in various ways. For example, when the flexible plate 171 is formed of a metal plate, the connection member 176 may be implemented by a bolt welded to the metal plate. In this case, the connection member 176 implemented by the bolt is inserted into a hole 181 formed in the conveyance plate 173, and then, fastened to a separate nut 182, and so on, such that the flexible plate 171 can be connected to the conveyance plate 173 of the conveyor 172.

Figure 2:
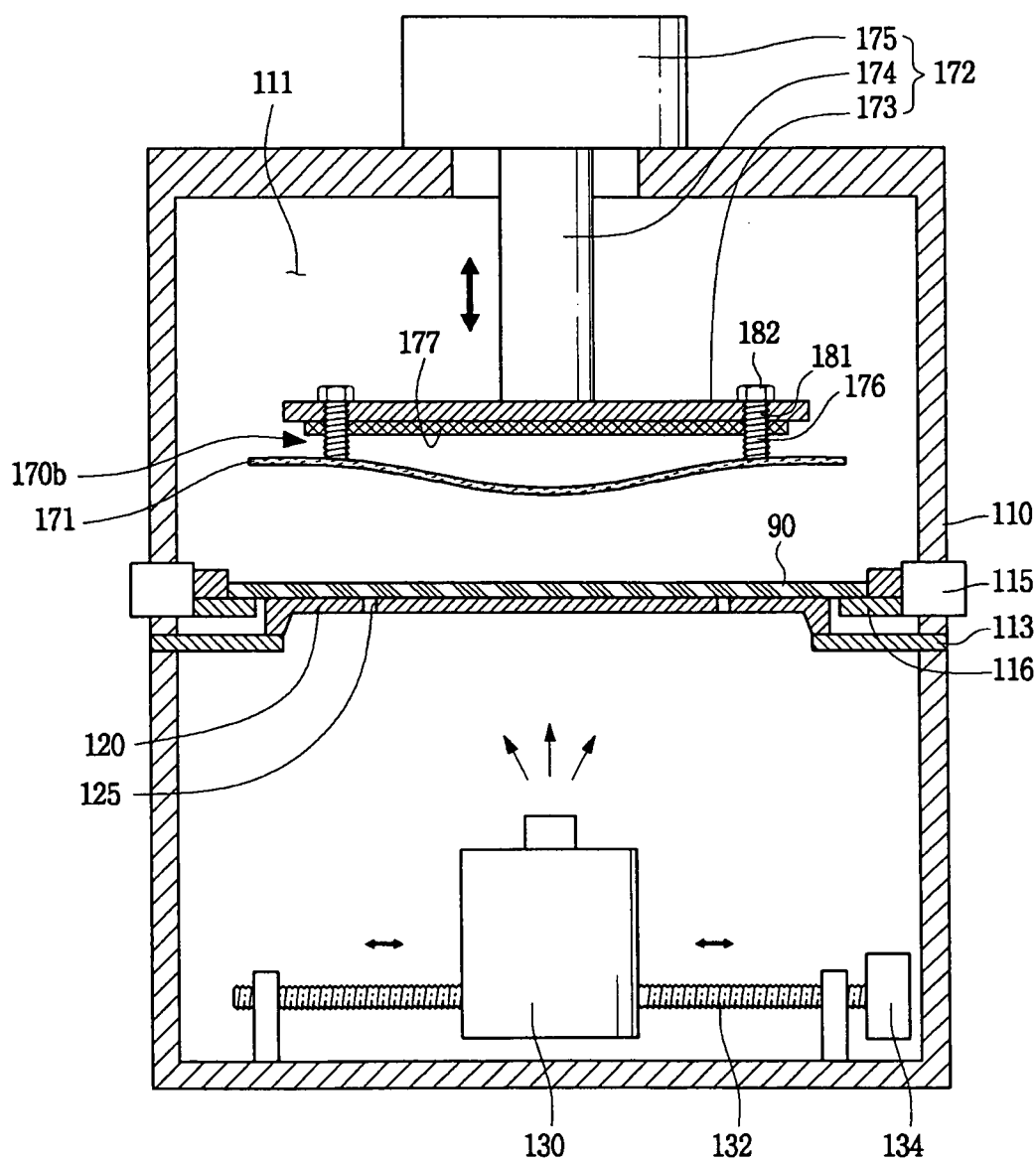
FIG. 2 is a cross-sectional view of an apparatus for fabricating an organic light emitting diode display device in accordance with a second exemplary embodiment of the present invention.

Meanwhile, the apparatus for fabricating an organic light emitting diode display device in accordance with an exemplary embodiment of the present invention also can be implemented as shown in FIG. 2.

FIG. 2 is a cross-sectional view of an apparatus for fabricating an organic light emitting diode display device in accordance with a second exemplary embodiment of the present invention. Referring to FIG. 2, the apparatus for fabricating an organic light emitting diode display device in accordance with a second exemplary embodiment of the present invention includes another structure of holding unit 170b, different from the apparatus shown in FIG. 1.

That is, the holding unit 170b installed at the apparatus for fabricating an organic light emitting diode display device in accordance with a second exemplary embodiment of the present invention further includes a magnet 177 disposed over the flexible plate 171 and applying a magnetic field to the mask 120 to pull the mask 120 toward the lower surface of the substrate 90 while the flexible plate 171 presses the upper surface of the substrate 90. At this time, the mask 120 may be formed of a magnetic metal material, which is capable of being attracted to the magnet, to respond to magnetic field applied from the magnet 177.

Therefore, when the conveyor 172 conveys the flexible plate 171 onto the upper surface of the substrate 90 in order to press the substrate 90 with the flexible plate 171, the magnetic force of the magnet disposed over the flexible plate 171 is applied to the mask 120. As a result, the mask 120 is attracted to the lower surface of the substrate 90 by the magnetic force of the magnet 177.

Here, the magnet 177 may have a plate shape and can be installed at the lower surface of the conveyance plate 173 of the conveyor 172. In addition, the magnet 177 may be spaced apart by a predetermined distance from the flexible plate 171 in order to prevent applying an excessive magnetic force to the mask 120. Further, the flexible plate 171 may be formed of a non-magnetic thin metal plate, which does not respond to magnetic field, in order to avoid attraction caused by the magnetic field when the magnet applies a magnetic force to the mask 120. When the flexible plate 171 is formed of a magnetic material attracted by the magnetic force of the magnet 177, the flexible plate 171 is attracted by the magnetic force to be deformed according to a bending shape of the substrate 90. Here, the flexible plate 171 may be formed of stainless steel or tungsten having no magnetism.

In addition, the magnet 177 may be a permanent magnet or an electromagnet. Further, if the magnet 177 is an electromagnet, the magnetic force, which is to be applied to the mask 120, may be applied within a specific time only during the process time. For example, during the layer deposition process, when the magnet 177 is implemented by an electromagnet, an application time of the magnetic force to the mask 120 may be from the time that the flexible plate 171 is in contact with the upper surface of the substrate 90 to the time that the layer deposition process is completed during the layer deposition process time.

Figure 3:
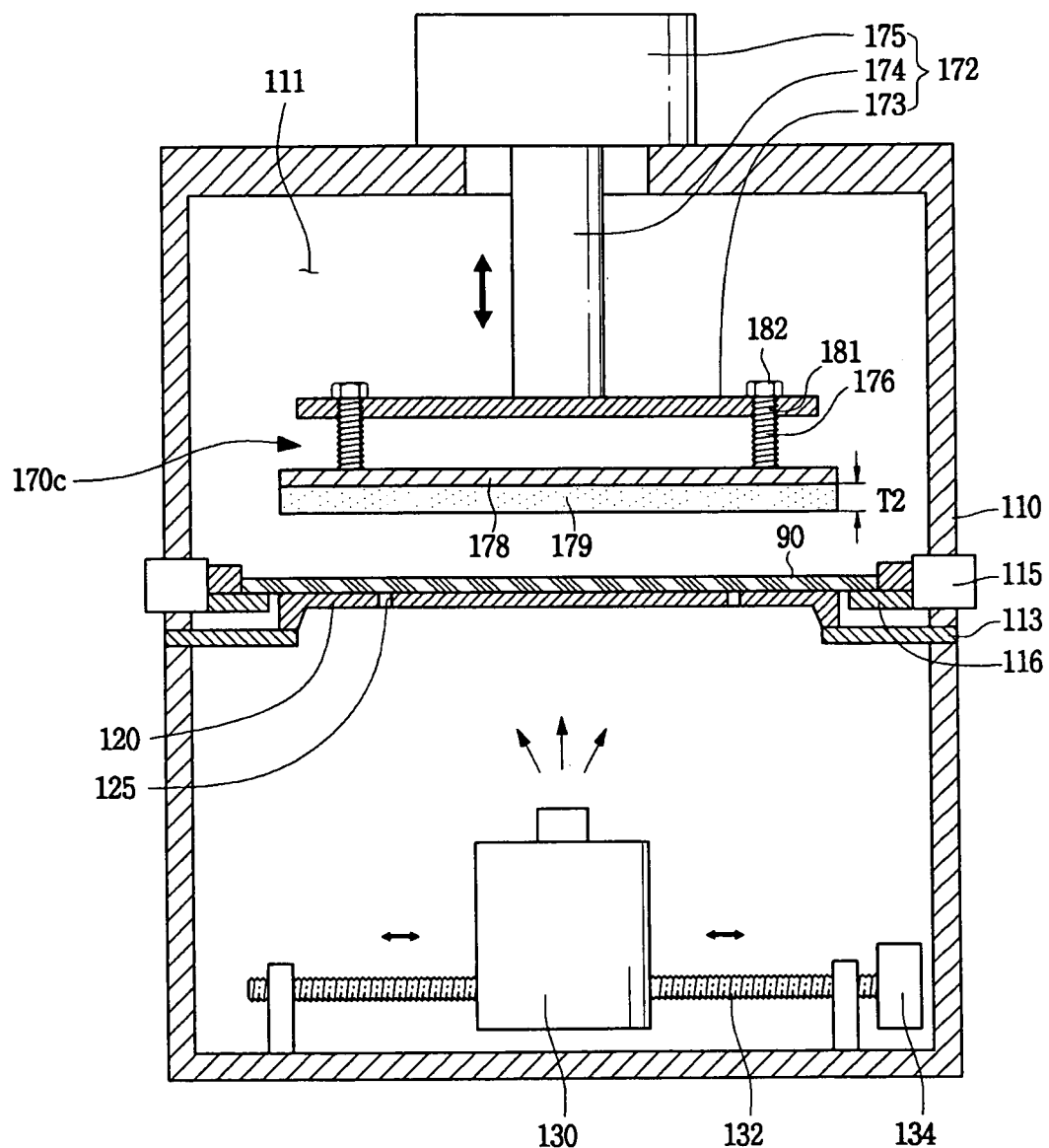
FIG. 3 is a cross-sectional view of an apparatus for fabricating an organic light emitting diode display device in accordance with a third exemplary embodiment of the present invention.

Furthermore, the apparatus for fabricating an organic light emitting diode display device in accordance with an exemplary embodiment of the present invention can be implemented as shown in FIG. 3.

FIG. 3 is a cross-sectional view of an apparatus for fabricating an organic light emitting diode display device in accordance with a third exemplary embodiment of the present invention. Referring to FIG. 3, the apparatus for fabricating an organic light emitting diode display device in accordance with a third exemplary embodiment of the present invention includes another structure of holding unit 170c, different from the apparatuses shown in FIGS. 1 and 2.

That is, the holding unit 170c installed at the apparatus for fabricating an organic light emitting diode display device in accordance with a third exemplary embodiment of the present invention includes a pressing plate 178 disposed over the substrate 90 to press the upper surface of the substrate 90, an elastic member 179 installed at the lower surface of the pressing plate 178 and capable of being deformed according to a bending shape of the substrate 90 when the pressing plate 178 presses the substrate 90, a conveyor 172 disposed over the pressing plate 178 to convey the pressing plate 178 onto the upper surface of the substrate 90 such that the pressing plate 178 presses the substrate 90, and a connection member 176 for connecting the pressing plate 178 to the conveyor 172. The elastic member 179 can be referred to as an embodiment of a flexible member. In this case, the flexible member includes the elastic member 179.

The pressing plate 178 has a size and shape similar to the substrate 90. For example, the pressing plate 178 has a plate shape similar to the substrate 90. In addition, the pressing plate 178 may be formed of a metal plate having a certain thickness to prevent bending when the substrate 90 is pressed. For example, the pressing plate 178 may be formed of aluminum.

The elastic member 179 may be formed of an elastic material to be deformed according to a bending shape of the substrate 90, and may have a thickness T2 larger than a maximum sagging amount, i.e., a maximum bending amount of the substrate 90. For example, the elastic member 179 may be a heat conductive sheet formed of an elastic material such as silicon rubber or silicon-based resin, and may have a thickness T2 of 2 mm to 5 mm. However, the kind and thickness of the elastic material may vary according to the kind of the process or the substrate 90.

The conveyor 172 includes a conveyance plate 173 disposed over the pressing plate 178 and spaced apart by a predetermined distance from the pressing plate 178, a conveyance rod 174 connected to an upper part of the conveyance plate 173, and a conveyance body 175 connected to the conveyance plate 173 via the conveyance rod 174 and vertically moving the conveyance rod 174 to vertically convey the conveyance plate 173. At this time, the conveyance body 175 may be installed at an outer wall of the chamber, or the like, and may be implemented by a cylinder, a motor, or the like. Meanwhile, when the conveyance body 175 is implemented by the cylinder, the conveyance rod 174 may be implemented by a piston. In addition, when the conveyance body 174 is implemented by the motor, the conveyance rod 174 may be implemented by a ball screw shaft vertically movable according to rotation of the motor. However, the conveyor 172 in accordance with the present invention may be implemented by another method, in addition to the cylinder or the ball screw shaft.

The connection member 176 functions to connect the pressing plate 178 to the conveyance plate 173 of the conveyor 172. The connection member 176 may also be implemented in various ways. For example, when the pressing plate 178 is formed of a metal plate, the connection member 176 may be implemented by a bolt welded to the metal plate. In this case, the connection member 176 implemented by the bolt is inserted into a hole 181 formed in the conveyance plate 173, and then, fastened to a separate nut 182, and so on, such that the pressing plate 178 can be connected to the conveyance plate 173 of the conveyor 172.

Figure 4:
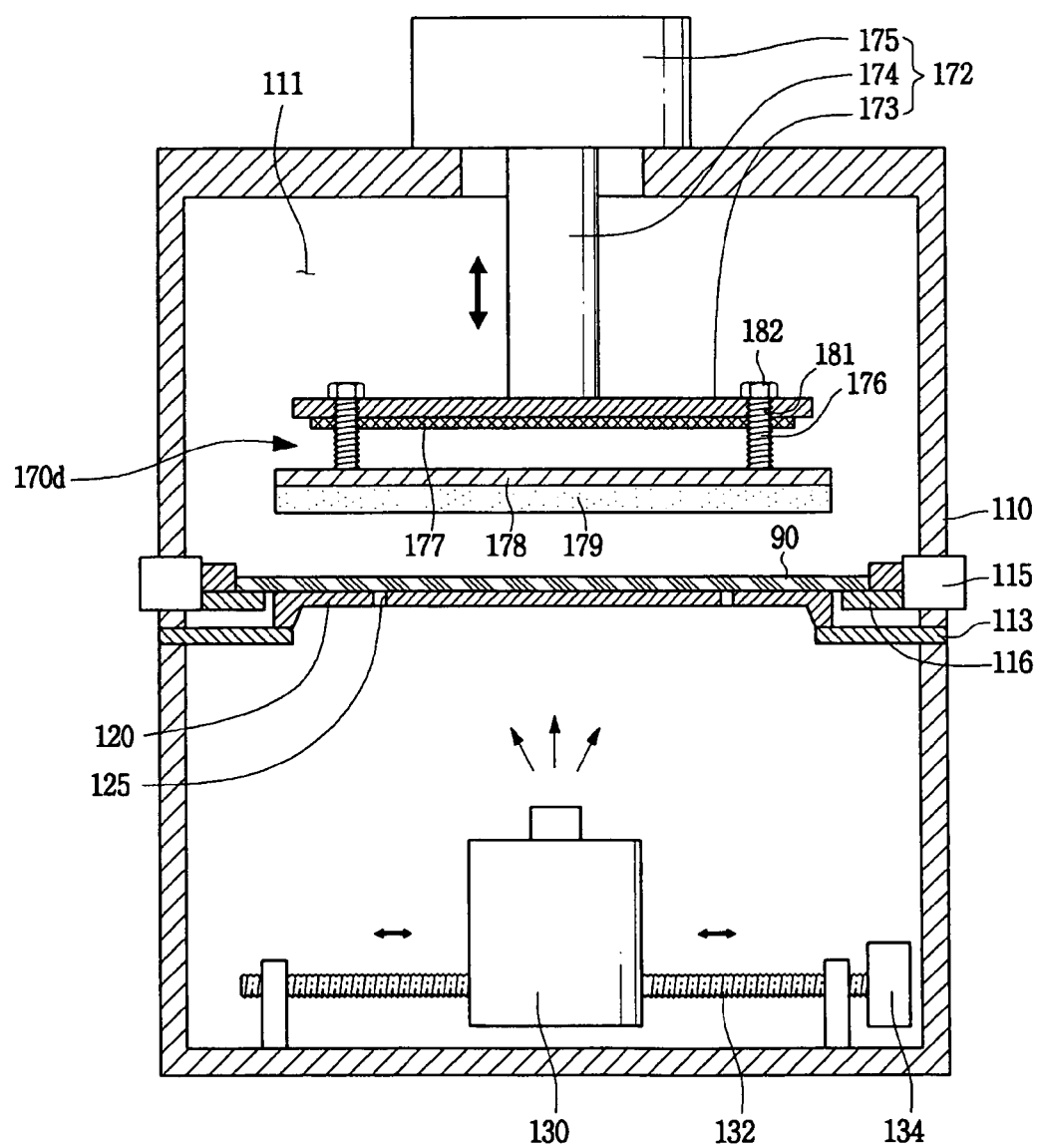
FIG. 4 is a cross-sectional view of an apparatus for fabricating an organic light emitting diode display device in accordance with a fourth exemplary embodiment of the present invention.

Meanwhile, the apparatus for fabricating an organic light emitting diode display device in accordance with an exemplary embodiment of the present invention can be implemented as shown in FIG. 4.

FIG. 4 is a cross-sectional view of an apparatus for fabricating an organic light emitting diode display device in accordance with a fourth exemplary embodiment of the present invention. Referring to FIG. 4, the apparatus for fabricating an organic light emitting diode display device in accordance with a fourth exemplary embodiment of the present invention includes another structure of holding unit 170d, different from the apparatus shown in FIG. 3.

That is, the holding unit 170d installed at the apparatus for fabricating an organic light emitting diode display device in accordance with a fourth exemplary embodiment of the present invention further includes a magnet 177 disposed over the pressing plate 178 and applying a magnetic force to the mask 120 to pull the mask 120 toward the lower surface of the substrate 90 when the pressing plate 178 presses the upper surface of the substrate 90. At this time, the mask 120 may be formed of a magnetic metal material to respond a magnetic field applied from the magnet 177.

Therefore, when the conveyor 172 conveys the pressing plate 178 onto the upper surface of the substrate 90 in order to press the substrate 90 by the pressing plate 178 and the elastic member 179, the magnetic force of the magnet disposed over the pressing plate 178 is applied to the mask 120. As a result, the mask 120 is attracted to the lower surface of the substrate 90 by the magnetic force of the magnet 177.

Here, the magnet 177 may have a plate shape and may be installed at the lower surface of the conveyance plate 173 of the conveyor 172. In addition, the magnet 177 may be spaced apart by a predetermined distance from the pressing plate 178 in order to prevent applying an excessive magnetic force to the mask 120. Further, the pressing plate 178 may be formed of a non-magnetic thin metal plate in order to avoid attraction caused by the magnetic force when the magnet applies a magnetic force to the mask 120. For example, the pressing plate 178 may be formed of stainless steel or tungsten having no magnetism.

In addition, the magnet 177 may be a permanent magnet or an electromagnet. Further, when the magnet 177 is an electromagnet, the magnetic force applied to the mask 120 may be applied within a specific time only during the process time. For example, during the layer deposition process, when the magnet 177 is implemented by an electromagnet, an application time of the magnetic force to the mask 120 may be from the time that the elastic member 179 is in contact with the upper surface of the substrate 90 to the time that the layer deposition process is completed during the layer deposition process time.

Figure 5:
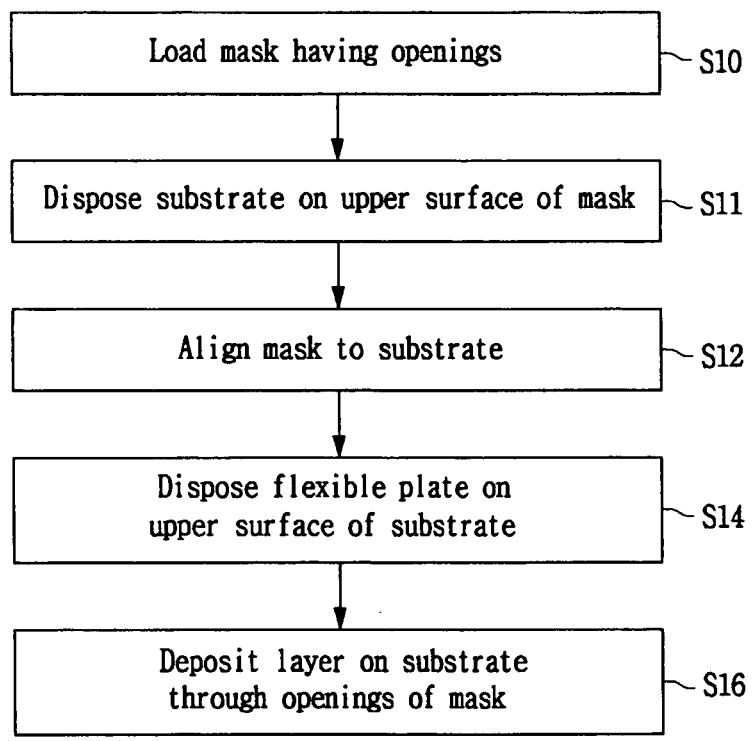
FIG. 5 is a flowchart showing a method of fabricating an organic light emitting diode display device in accordance with a first exemplary embodiment of the present invention.

Embodiments of Method for Fabricating Organic Light Emitting Diode Display Device FIG. 5 is a flowchart showing a method of fabricating an organic light emitting diode display device in accordance with a first exemplary embodiment of the present invention.

Referring to FIG. 5, the method of fabricating an organic light emitting diode display device in accordance with a first exemplary embodiment of the present invention uses an apparatus for fabricating an organic light emitting diode display device in accordance with a first exemplary embodiment of the present invention. The method includes a mask loading step S10 of loading a mask 120 having a certain pattern of openings 125 inside a chamber 110, a substrate disposition step S11 of disposing a substrate 90 on the upper surface of the mask 120, a substrate-mask alignment step S12 of aligning the mask 120 to the substrate 90 such that a device pattern on the substrate 90 is aligned to the openings 125 of the mask 120, a substrate disposing and pressing step S14 of disposing and pressing the upper surface of the substrate 90 toward the mask 120 using a holding unit (see 170a of FIG. 1) where a part of the holding unit is deformed according to a bending shape of the substrate 90 such that the mask 120 contacts the lower surface of the semiconductor 90 and presses the upper surface of the substrate 90, and a deposition material supply step S16 of supplying a deposition material toward the mask 120 from a deposition material source 130, which is disposed under the mask 120, to form a layer on the substrate 90 through the openings 125 of the mask 120.

At this time, since the holding unit 170a includes a flexible plate 171 deformed according to a bending shape of the substrate 90 and a conveyor 172 for conveying the flexible plate 171, the substrate disposing and pressing step S14 may include disposing the flexible plate 171 on the upper surface of the substrate 90 using the conveyor 172 such that the upper surface of the substrate 90 is pressed by the weight of the flexible plate 171.

Therefore, in the layer deposition process, and so on, even when the central area of the large-sized substrate 90 and mask 120 are sagged or bent downward, the flexible plate 171 of the holding unit 170a is deformed according to a bending shape of the substrate 90 and presses the upper surface of the substrate. As a result, the lower surface of the substrate 90 closely contacts the upper surface of the mask 120 to prevent any loosened space that can be formed between the lower surface of the substrate 90 and the upper surface of the mask 120. Therefore, using the holding unit 170a including the flexible plate 171 in accordance with the present invention, it is possible to prevent degradation of a pattern layer caused by the loosened space between the substrate 90 and the mask 120, and to achieve deposition of a good pattern layer on the substrate 90.

At this time, the flexible plate 171 may be formed of a relatively heavy metal material to press the substrate 90 by its weight. For example, the flexible plate 171 may be formed of stainless steel or tungsten. In addition, the flexible plate 171 formed of the metal material may be formed of a thin plate having a thickness T1 such that the flexible plate 171 can be deformed according to a bending shape of the substrate 90. For example, the flexible plate 171, i.e., the thin metal plate, may have a thickness T1 of 0.1 mm to 0.6 mm.

Figure 6:
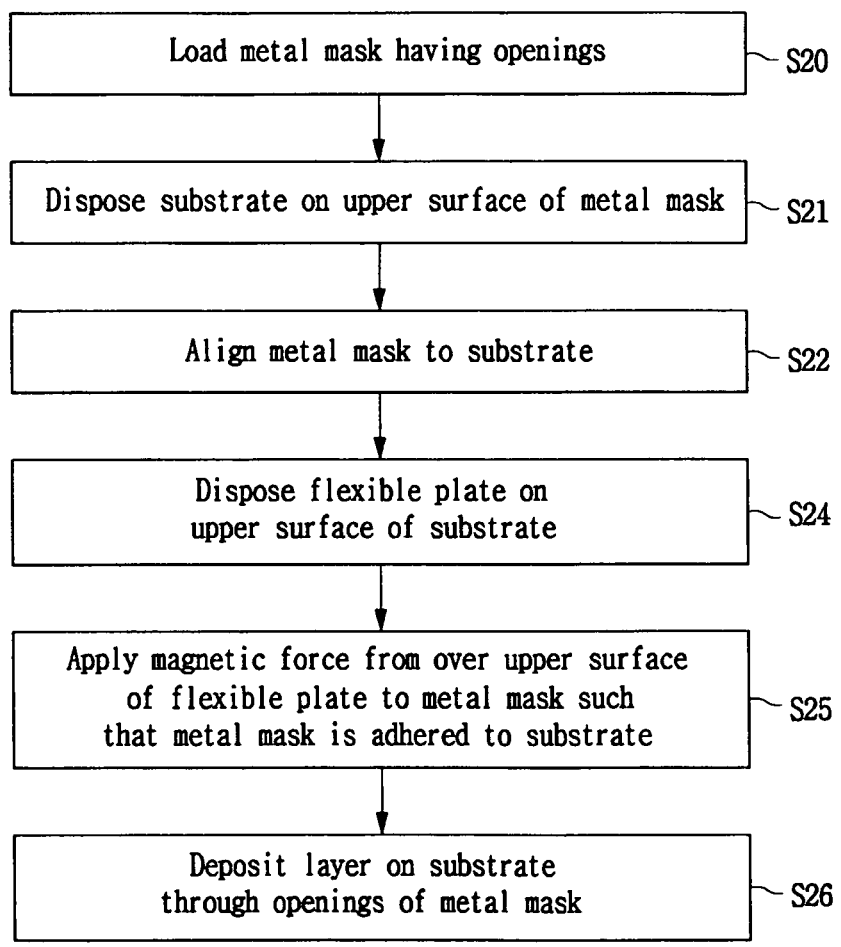
FIG. 6 is a flowchart showing a method of fabricating an organic light emitting diode display device in accordance with a second exemplary embodiment of the present invention.

Meanwhile, the method of fabricating an organic light emitting diode display device in accordance with an exemplary embodiment of the present invention can be implemented as shown in FIG. 6.

FIG. 6 is a flowchart showing a method of fabricating an organic light emitting diode display device in accordance with a second exemplary embodiment of the present invention.

Referring to FIG. 6, the method of fabricating an organic light emitting diode display device in accordance with a second exemplary embodiment of the present invention uses an apparatus for fabricating an organic light emitting diode display device in accordance with a second exemplary embodiment of the present invention. the method includes a mask loading step S20 of loading a metal mask 120 having a certain pattern of openings 125 inside a chamber 110, a substrate disposition step S21 of disposing a substrate 90 on the upper surface of the metal mask 120, a substrate-mask alignment step S22 of aligning the metal mask 120 to the substrate 90 such that a device pattern on the substrate 90 is aligned to the openings 125 of the metal mask 120, a disposing step S24 of disposing the flexible plate 171 on the upper surface of the substrate 90 using the conveyor 172 such that the upper surface of the substrate 90 is pressed by the weight of the flexible plate 171, a step S25 of applying a magnetic force to the mask 120 using a magnet 177 disposed over the flexible plate 171 such that the metal mask 120 is pulled toward the lower surface of the substrate 90 by the magnetic force when the upper surface of the substrate 90 is pressed by the weight of the flexible plate 171, and a deposition material supply step S26 of supplying a deposition material toward the metal mask 120 using a deposition material source 130, disposed under the metal mask 120, to form a layer on the substrate 90 through the openings 125 of the metal mask 120.

Therefore, in the layer deposition process, and so on, even though the central area of the large-sized substrate 90 and metal mask 120 are sagged or bent downward, the flexible plate 171 is deformed according to a bending shape of the substrate 90 and presses the upper surface of the substrate, and the metal mask 120 is pulled toward the lower surface of the substrate 90 using the magnetic force of the magnet 177. As a result, the lower surface of the substrate 90 contacts the upper surface of the metal mask 120 to prevent a loosened space between the lower surface of the substrate 90 and the upper surface of the metal mask 120. Therefore, using the holding unit 170b including the flexible plate 171 and the magnet 177 in accordance with the present invention, it is possible to prevent degradation of a pattern layer caused by the loosened space between the substrate 90 and the mask 120, and to achieve deposition of a good pattern layer on the substrate 90.

Here, the magnet 177 may have a plate shape and may be installed at the lower surface of the conveyance plate 173 of the conveyor 172. In addition, the magnet 177 may be spaced apart by a predetermined distance from the flexible plate 171 in order to prevent an application of excessive magnetic force from being applied to the mask 120. Further, the flexible plate 171 may be formed of a non-magnetic thin metal plate in order to avoid attraction caused by the magnetic force when the magnet applies a magnetic force to the mask 120. For example, the flexible plate 171 may be formed of aluminum having no magnetism.

In addition, the magnet 177 may be a permanent magnet or an electromagnet. Further, when the magnet 177 is an electromagnet, the magnetic force applied to the mask 120 may be applied within a specific time only during the process time. For example, during the layer deposition process, when the magnet 177 is implemented by an electromagnet, an application time of the magnetic force to the mask 120 may be from the time that the flexible plate 171 is in contact with the upper surface of the substrate 90 to the time that the layer deposition process is completed during the layer deposition process time.

Figure 7:
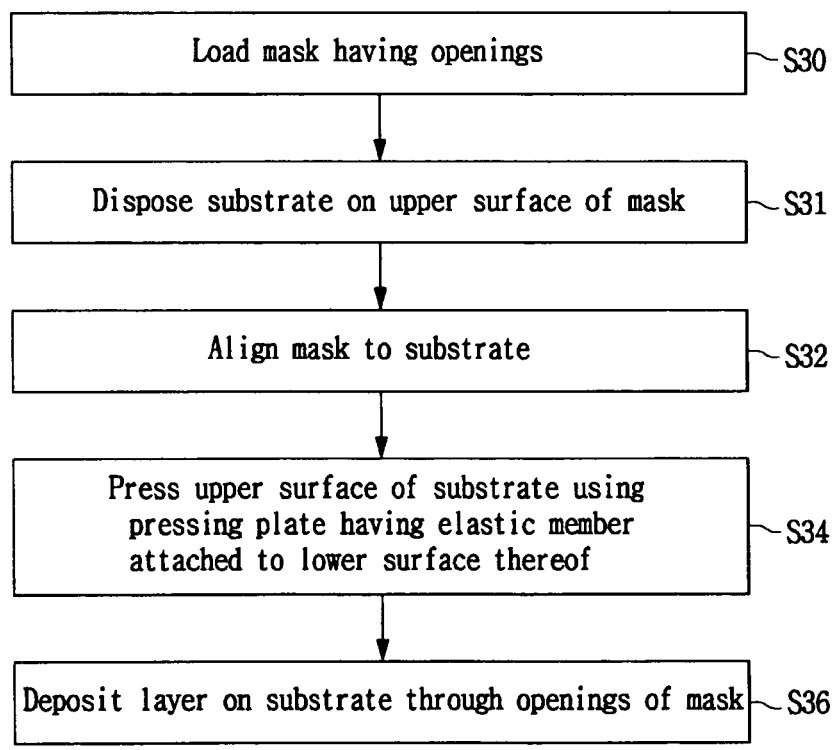
FIG. 7 is a flowchart showing a method of fabricating an organic light emitting diode display device in accordance with a third exemplary embodiment of the present invention.

The method of fabricating an organic light emitting diode display device in accordance with an exemplary embodiment of the present invention can be implemented as shown in FIG. 7.

FIG. 7 is a flowchart showing a method of fabricating an organic light emitting diode display device in accordance with a third exemplary embodiment of the present invention.

Referring to FIG. 7, the method of fabricating an organic light emitting diode display device in accordance with a third exemplary embodiment of the present invention uses an apparatus for fabricating an organic light emitting diode display device in accordance with a third exemplary embodiment of the present invention. The method includes a mask loading step S30 of loading a mask 120 having a certain pattern of openings 125 into a chamber 110, a substrate disposition step S31 of disposing a substrate 90 on the upper surface of the mask 120, a substrate-mask alignment step S32 of aligning the mask 120 to the substrate 90 such that a device pattern on the substrate 90 is aligned to the openings 125 of the mask 120, a substrate pressing step S34 of conveying a pressing plate 178 having an elastic member, which is attached to the lower surface thereof and is capable of being deformed according to a bending shape of the substrate 90, using a conveyor 172 onto the upper surface of the substrate 90 to press the upper surface of the substrate 90 such that the mask 120 contacts the lower surface of the substrate 90, and a deposition material supply step S36 of supplying a deposition material toward the mask 120 from a deposition material source 130 disposed under the mask 120 to form a layer on the substrate 90 through the openings 125 of the mask 120.

Therefore, in the layer deposition process, and so on, even though the central area of the large-sized substrate 90 and mask 120 are sagged or bent downward, the elastic member 179 is deformed according to a bending shape of the substrate 90 and presses the upper surface of the substrate. As a result, the lower surface of the substrate 90 contacts the upper surface of the mask 120 to prevent a loosened space between the lower surface of the substrate 90 and the upper surface of the mask 120. Therefore, using the holding unit 170a including the elastic member 179 in accordance with the present invention, it is possible to prevent degradation of a pattern layer caused by the loosened space between the substrate 90 and the mask 120, and to achieve deposition of a good pattern layer on the substrate 90.

Here, the pressing plate 178 may be formed of a metal plate having a certain thickness to prevent bending thereof when the substrate 90 is pressed. For example, the pressing plate 178 may be formed of aluminum.

In addition, the elastic member 179 may be formed of an elastic material to be deformed according to a bending shape of the substrate 90, and may have a thickness T2 larger than a maximum sagging amount, i.e., a maximum bending amount of the substrate 90. For example, the elastic member 179 may be a heat conductive sheet formed of an elastic material such as silicon rubber or silicon-based resin, and may have a thickness T2 of 2 mm to 5 mm. However, the kind and thickness of the elastic material may vary according to the kind of the process or the substrate 90.

Figure 8:
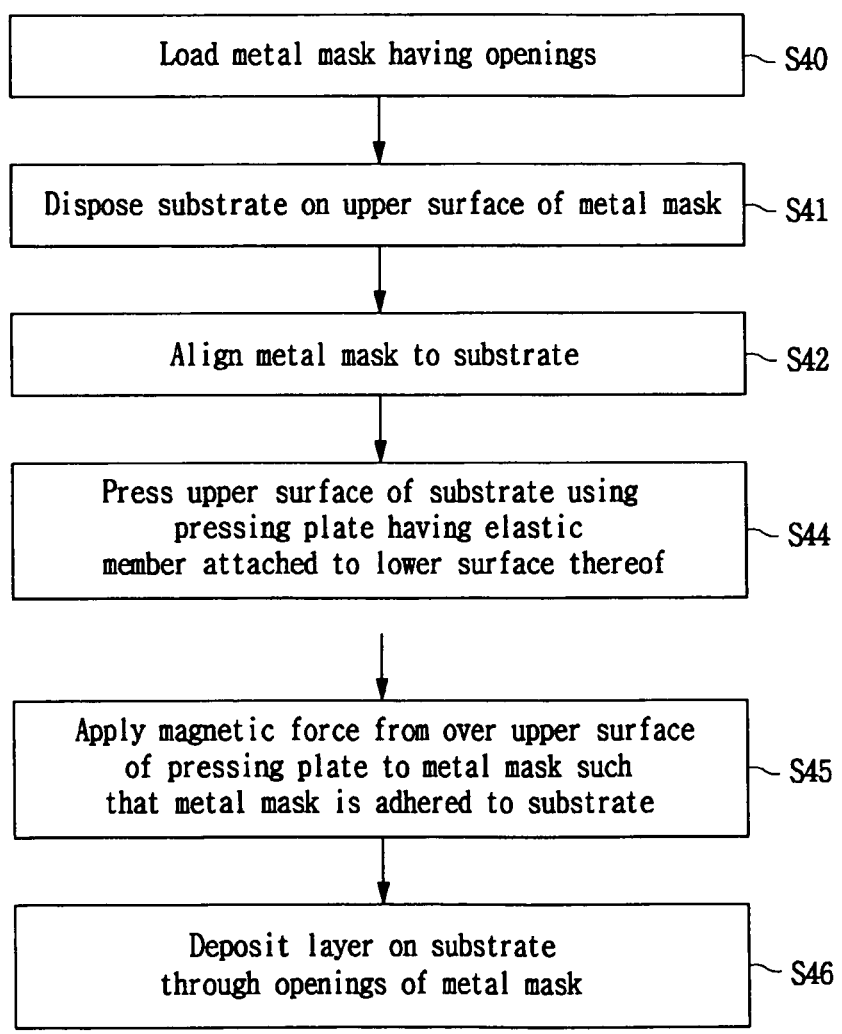
FIG. 8 is a flowchart showing a method of fabricating an organic light emitting diode display device in accordance with a fourth exemplary embodiment of the present invention.

Meanwhile, the method of fabricating an organic light emitting diode display device in accordance with an exemplary embodiment of the present invention can be implemented as shown in FIG. 8.

FIG. 8 is a flowchart showing a method of fabricating an organic light emitting diode display device in accordance with a fourth exemplary embodiment of the present invention.

Referring to FIG. 8, the method of fabricating an organic light emitting diode display device in accordance with a fourth exemplary embodiment of the present invention uses an apparatus for fabricating an organic light emitting diode display device in accordance with a fourth exemplary embodiment of the present invention. The method includes a mask loading step S40 of loading a metal mask 120 having a certain pattern of openings 125 into a chamber 110, a substrate disposition step S41 of disposing a substrate 90 on the upper surface of the metal mask 120, a substrate-mask alignment step S42 of aligning the metal mask 120 to the substrate 90 such that a device pattern on the substrate 90 is aligned to the openings 125 of the metal mask 120, a substrate pressing step S44 of conveying a pressing plate 178 having an elastic member, which is attached to the lower surface thereof and is capable of being deformed according to a bending shape of the substrate 90, using a conveyor 172 onto the upper surface of the substrate 90 to press the upper surface of the substrate 90 such that the metal mask 120 contacts the lower surface of the substrate 90, a step S45 of applying a magnetic force to the metal mask 120 using a magnet disposed over the pressing plate 178 such that the metal mask 120 is pulled toward the lower surface of the substrate 90 by the magnetic force when the substrate 90 is pressed by the pressing plate 178 and the elastic member 179, and a deposition material supply step S46 of supplying a deposition material toward the metal mask 120 from a deposition material source 130 disposed under the metal mask 120 to form a layer on the substrate 90 through the openings 125 of the metal mask 120.

Therefore, in the layer deposition process, and so on, even when the central area of the large-sized substrate 90 and mask 120 are sagged or bent downward, the elastic member 179 is deformed according to a bending shape of the substrate 90 and presses the upper surface of the substrate, and the metal mask 120 is pulled toward the lower surface of the substrate 90 using the magnetic force of the magnet 177. As a result, the lower surface of the substrate 90 contacts the upper surface of the mask 120 to prevent a loosened space between the lower surface of the substrate 90 and the upper surface of the mask 120. Therefore, using the holding unit 170a including the elastic member 179 in accordance with the present invention, it is possible to prevent degradation of a pattern layer caused by the loosened space between the substrate 90 and the mask 120, and to achieve deposition of a good pattern layer on the substrate 90.

Here, the pressing plate 178 may be formed of a metal plate having a certain thickness to prevent bending thereof when the substrate 90 is pressed. For example, the pressing plate 178 may be formed of aluminum.

In addition, the elastic member 179 may be formed of an elastic material to be deformed according to a bending shape of the substrate 90, and may have a thickness T2 larger than a maximum sagging amount, i.e., a maximum bending amount of the substrate 90. For example, the elastic member 179 may be a heat conductive sheet formed of an elastic material such as silicon rubber or silicon-based resin, and may have a thickness T2 of 2 mm to 5 mm. However, the kind and thickness of the elastic material may vary according to the kind of the process or the substrate 90.

Here, the magnet 177 may have a plate shape and may be installed at the lower surface of the conveyance plate 173 of the conveyor 172. In addition, the magnet 177 may be spaced apart by a predetermined distance from the pressing plate 178 in order to prevent an application of excessive magnetic force from being applied to the mask 120. Further, the flexible plate 171 may be formed of a non-magnetic thin metal plate in order to avoid attraction caused by the magnetic force when the magnet applies a magnetic force to the mask 120. For example, the pressing plate 178 may be formed of stainless steel or tungsten having no magnetism.

In addition, the magnet 177 may be a permanent magnet or an electromagnet. Further, when the magnet 177 is an electromagnet, the magnetic force applied to the mask 120 may be applied within a specific time only during the process time. For example, during the layer deposition process, when the magnet 177 is implemented by an electromagnet, an application time of the magnetic force to the mask 120 may be from the time that the elastic member 179 is in contact with the upper surface of the substrate 90 to the time that the layer deposition process is completed during the layer deposition process time.

As can be seen from the foregoing, since a substrate is pressed toward a mask using a holding unit, a part of which is deformed according to a bending shape of the substrate and presses the upper surface of the substrate, the mask can contact the substrate during a layer deposition process even when the substrate and the mask become larger. As a result, the mask can contact the lower surface of the substrate to prevent a loosened space between the lower surface of the substrate and the mask. Therefore, it is possible to prevent degradation of a pattern layer caused by the loosened space between the substrate and the mask, thereby depositing a good pattern layer on the substrate.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An apparatus for fabricating an organic light emitting diode display device, comprising:
   a chamber;
   a mask disposed inside the chamber and having a pattern of openings, a substrate being mounted on an upper surface of the mask;
   a deposition material source disposed under the mask and supplying a deposition material toward the substrate through the openings of the mask to form a layer on the substrate; and
   a holding unit disposed above the substrate and comprising:
   a pressing plate;
   an elastic member comprises an elastic material that includes silicon rubber, being arranged at a lower surface of the pressing plate, the elastic member contacting the substrate while the holding unit presses the substrate toward the mask, the elastic member being adapted to be deformed according to a sagging shape of a central area of the substrate upon the substrate being large and upon the pressing plate pressing the substrate; and
   a conveyor coupled to an upper surface of the pressing plate for conveying the pressing plate and the elastic member toward the substrate.

2. The apparatus according to claim 1, a thickness of the elastic member ranges from 2 mm to 5 mm.

3. The apparatus according to claim 1, the holding unit further comprises a magnet disposed above the pressing plate for applying a magnetic force to the mask to pull the mask toward the substrate when the pressing plate presses the upper surface of the substrate, the mask being comprised of a magnetic metal material that is capable of being attracted to the magnet, the pressing plate being comprised of a non-magnetic metal plate that does not respond to magnetic field, the magnet being spaced-apart from the pressing plate by a gap.

4. The apparatus of claim 3, the gap being an empty space.

5. The apparatus of claim 1, the elastic member being a heat conductive sheet.

6. The apparatus of claim 1, the conveyor comprising a conveyor plate arranged parallel to the pressing plate and being spaced-apart from the pressing plate by a distance.

7. The apparatus of claim 6, further comprising a plurality of bolts to connect the pressing plate to the conveyor plate.

8. The apparatus of claim 7, the bolts being welded to the pressing plate and passing through apertures in the conveyor plate.

9. The apparatus of claim 1, further comprising a mask support frame projecting inwardly from inner walls of the chamber by a certain length to support edges of the mask.

10. The apparatus of claim 9, further comprising:
    a substrate conveyor movably installed on the inner walls of the chamber and above the mask support frame for vertically moving the substrate onto the upper surface of the mask; and
    a substrate support frame extending inwardly from the substrate conveyor to support edges of the substrate.

11. An apparatus for fabricating an organic light emitting diode display device according to a method of fabricating an organic light emitting diode display device, the method comprising:
    loading a mask inside a chamber, the mask having a pattern of openings;
    disposing a substrate on an upper surface of the mask;
    pressing the substrate toward the mask with a holding unit to make the mask contact the substrate; and
    supplying a deposition material toward the mask from a deposition material source that is disposed under the mask to form a layer on the substrate through the openings of the mask;
    wherein the holding unit comprises:
    a pressing plate for pressing the substrate;
    an elastic member installed at a lower surface of the pressing plate and adapted to be deformed according to a deformed sagging shape of the substrate while the pressing plate presses the substrate; and
a conveyor coupled to an upper part of the pressing plate for conveying the pressing plate; and
the step of pressing the substrate comprises conveying the pressing plate toward the substrate using the conveyor such that the substrate is pressed by the pressing plate and by the elastic member, wherein the holding unit further comprises a magnet disposed above the pressing plate for applying a magnetic force to the mask to pull the mask toward the substrate when the pressing plate presses the upper surface of the substrate, the mask being comprised of a magnetic metal material that is capable of being attracted to the magnet, the pressing plate being comprised of a non-magnetic metal plate that does not respond to a magnetic field, the magnet being spaced apart from the pressing plate by a gap.

\* \* \* \* \*